United States Patent [19]

Hacker et al.

[11] Patent Number: 4,948,629

[45] Date of Patent: Aug. 14, 1990

[54] DEPOSITION OF DIAMOND FILMS

[75] Inventors: Nigel P. Hacker, Morgan Hill; George W. Tyndall, III, Los Gatos, both of Calif.

[73] Assignee: International Business Machines Corporation, Armonk, N.Y.

[21] Appl. No.: 309,521

[22] Filed: Feb. 10, 1989

[51] Int. Cl.$^5$ .............................. B05D 3/06; B01J 3/06
[52] U.S. Cl. ..................................... 427/53.1; 423/446
[58] Field of Search ..................... 427/53.1, 54.1, 35, 427/36; 423/466, 447.3

[56] References Cited

U.S. PATENT DOCUMENTS

| | | | |
|---|---|---|---|
| 3,961,103 | 6/1976 | Aisenberg | 427/39 |
| 4,434,188 | 2/1984 | Kamo et al. | 427/39 |
| 4,490,229 | 12/1984 | Mirtich et al. | 204/192 |
| 4,604,294 | 8/1986 | Tanaka et al. | 427/53.1 |
| 4,816,286 | 3/1989 | Hirose | 427/39 |

FOREIGN PATENT DOCUMENTS

| | | | |
|---|---|---|---|
| 0288065 | 10/1988 | European Pat. Off. | 423/446 |
| 0199919 | 10/1985 | Japan | 423/447.3 |
| 0199920 | 10/1985 | Japan | 423/447.3 |
| 1158899 | 7/1986 | Japan | 423/446 |
| 2223095 | 10/1987 | Japan | 423/446 |

OTHER PUBLICATIONS

Matsumoto et al., Journal of Materials Science, V. 17, (1982) pp. 3106–3112.

Hirose et al., Jap. J. Appl. Phys., V. 25, pp. L519–L521.

*Primary Examiner*—Shrive Beck
*Assistant Examiner*—Marianne L. Padgett
*Attorney, Agent, or Firm*—Joseph G. Walsh

[57] ABSTRACT

Diamond films are deposited at substrates below temperatures of 400° C. by chemical vapor deposition using a high powered pulsed laser and a vapor which is an aliphatic carboxylic acid or an aromatic carboxylic anhydride.

8 Claims, No Drawings

DEPOSITION OF DIAMOND FILMS

DESCRIPTION

1. Technical Field

The present invention is concerned with a laser-assisted chemical vapor deposition process for creating diamond films.

2. Background Art

In the prior art, temperatures in the range of 800°–1,000° C. have been required to produce deposits of diamond films. Matsumoto et al., J. Mat. Sci., V. 17, p. 3106, 1982. The required use of such high temperatures has drastically limited the practical application of such processes.

Processes for depositing diamond films including thermal chemical vapor deposition, plasma chemical deposition, and electron-assisted chemical vapor deposition. RF sputtering and ion beam have also been reported in the literature. Hirose et al., JAP J. Appl. Phys., 25, L519, 1986. These processes typically require severe conditions with high substrate temperatures (650°–1,200° C.) which will destroy most substrates used in electronic applications.

U.S. Pat. Nos. 3,961,103, 4,434,188, 4,490,229 and 4,604,294 all show various film deposition processes, but they obviously differ from the process of the present invention.

DESCRIPTION OF THE INVENTION

According to the present invention, diamond films are deposited on substrates by a process using an organic compound which vaporizes without decomposition and which is either an aliphatic carboxylic acid or an aromatic carboxylic anhydride. The process requires the use of a high powered, pulsed laser, such as an excimer laser or a Nd:YAG laser.

Aliphatic carboxylic acids useful in the present invention include the preferred compounds malonic acid and acetic acid. The preferred aromatic carboxylic anhydride for use in the present invention is pyromellitic dianhydride.

Preferred excimer laser wavelengths for use in the present invention include KrCl at 220 nm, KrF at 248 nm, XeCl at 308 nm and XeF at 351 nm. Preferred wavelengths from the Nd:YAG laser include the fourth harmonic at 266 nm and the third harmonic at 355 nm. At these wavelengths the deposited diamond film will not be ablated.

In carrying out the invention, the proper acid or anhydride is evaporated into a confined space wherein the substrate is located. The use of a carrier or buffer gas such as hydrogen, oxygen or argon is desired. Preferably the starting organic compound in the vapor phase is present at a concentration of from about 1/10% to 10% by weight of the total gas, most preferably about 5%. The total pressure should preferably be between 0.1 Torr and 100 Torr, most preferably between 1 Torr and 10 Torr. It is a particularly noteworthy feature of the present invention that the initial temperature of the substrate is below 400° C., and in fact is preferably less than 150° C. This is in sharp contrast to prior art methods which require much higher temperatures. Room temperature may conveniently be used as may temperatures as low as 0° C. In the operation of the process, a film of diamond is deposited on the substrate where the laser strikes the substrate. The area of the deposition is controlled by the area of the laser beam and is limited only by the size of the laser beam. A second laser using longer wavelength light (>400 nm), e.g. second harmonic of Nd:YAG at 532 nm, can also be used in conjunction with the process described above to selectively remove $sp^2$ carbon and deposit a purer diamond film.

Diamond films have many properties desirable for use in the electronic industries. Diamonds films are hard, transparent, chemically inert, electronic insulators, semi-conductors and have low friction. The process of the present invention makes it possible to place a material with these desirable characteristics where desired. In instances where it is important that the deposited diamond film adhere tightly to the substrate, it is believed desirable that the substrate be a material which is a carbide or forms a carbide. Many metals are known to form carbides, for example, tungsten and molybdenum. A substrate particularly preferred for use in the present invention is silicon, most particularly silicon (111).

EXAMPLE 1

Malonic acid vapor and hydrogen were passed over a silicon substrate at room temperature (25° C.) and irradiated with a lightly focused KrF laser beam for 1.5 hours. The resulting deposit was 5 mm×15 mm and 1µ thick. Reflectance Raman spectroscopy and Auger spectroscopy of this sample shows it to be diamond.

EXAMPLE 2

In two separate experiments malonic acid and pyromellitic dianhydride were each introduced to the deposit cell by vaporization of the solids. He at 10 Torr was added as a buffer gas. The diamond deposition was initiated by the 248 nm laser photodissociation of the organic precursor. The second harmonic Nd:YAG laser (532 nm) was then used to photo-ablate any non-diamond inclusions in the film. The substrate temperature for these depositions was 150° C. Raman spectroscopy confirms the reduction in the amount of $sp^2$ contamination.

We claim:

1. A process for depositing a diamond film on a substrate said process comprising the steps of:
    (a) confining in an enclosed space which includes a substrate at a temperature below 400° C., the vapor of a compound which is aliphatic carboxylic acid or an aromatic carboxylic anhydride; and
    (b) irradiating said vapor with a high powered, pulsed laser which strikes the substrate thereby depositing a diamond film on the substrate at the places struck by the laser radiation.

2. A process as claimed in claim 1 wherein a carrier gas is employed.

3. A process as claimed in claim 2 wherein the carrier gas is hydrogen, oxygen or argon.

4. A process as claimed in claim 1 wherein the substrate temperature is below 150° C.

5. A process as claimed in claim 1 wherein the vapor is that of malonic acid.

6. A process as claimed in claim 1 wherein the vapor is that of acetic acid.

7. A process as claimed in claim 1 wherein the vapor is that of pyromellitic dianhydride.

8. A process as claimed in claim 1 wherein a second laser at longer wavelength (>400 nm) is used to reduce $sp^2$ contamination in deposited film.

* * * * *